(12) United States Patent
Kim

(10) Patent No.: US 11,881,276 B2
(45) Date of Patent: Jan. 23, 2024

(54) ERROR CORRECTING CODE DECODER

(71) Applicant: SK hynix Inc., Icheon (KR)

(72) Inventor: Dae Sung Kim, Icheon (KR)

(73) Assignee: SK hynix Inc., Icheon (KR)

( * ) Notice: Subject to any disclaimer, the term of this patent is extended or adjusted under 35 U.S.C. 154(b) by 217 days.

(21) Appl. No.: 17/500,803

(22) Filed: Oct. 13, 2021

(65) Prior Publication Data

US 2022/0359032 A1 Nov. 10, 2022

(30) Foreign Application Priority Data

May 7, 2021 (KR) .................. 10-2021-0059249

(51) Int. Cl.
*G11C 29/42* (2006.01)
*G11C 29/44* (2006.01)
*H03M 13/11* (2006.01)
*G11C 29/12* (2006.01)

(52) U.S. Cl.
CPC .......... *G11C 29/42* (2013.01); *G11C 29/1201* (2013.01); *G11C 29/4401* (2013.01); *H03M 13/1108* (2013.01); *H03M 13/1111* (2013.01)

(58) Field of Classification Search
CPC . G11C 29/42; G11C 29/1201; G11C 29/4401; H03M 13/1108; H03M 13/1111
See application file for complete search history.

(56) References Cited

U.S. PATENT DOCUMENTS

| | | | | |
|---|---|---|---|---|
| 10,521,291 B2* | 12/2019 | Ha | ........................ | G11C 16/26 |
| 10,734,091 B2* | 8/2020 | Takahashi | ........... | G06F 11/1068 |
| 11,450,400 B2* | 9/2022 | Yun | .................. | G11C 29/12005 |
| 2014/0068379 A1* | 3/2014 | Sakaue | ............... | G06F 11/1012 |
| | | | | 714/764 |

FOREIGN PATENT DOCUMENTS

KR 1020200020535 2/2020

* cited by examiner

*Primary Examiner* — Tuan T Nguyen

(57) ABSTRACT

An ECC decoder includes: a memory comprising a memory region; a first converter configured to transmit a hard bit, received from a channel, to the memory to store the hard bit in a first area of the memory region; a second converter configured to receive the hard bit read from the first area and output a reliability value corresponding to the hard bit, whenever a hard decoding operation on the hard bit is iterated; and a variable node configured to perform the hard decoding operation using the reliability value.

19 Claims, 10 Drawing Sheets ent application claims priority under 35 U.S.C. §
ERROR CORRECTING CODE DECODER

CROSS-REFERENCES TO RELATED APPLICATION

The present application claims priority under 35 U.S.C. § 119(a) to Korean patent application number 10-2021-0059249, filed on May 7, 2021, in the Korean Intellectual Property Office, which is incorporated herein by reference in its entirety.

BACKGROUND

1. Technical Field

Various embodiments generally relate to an error correcting code (ECC) decoder, and more particularly, to an ECC decoder which is included in a memory system.

2. Related Art

A memory system may be configured to store data provided by a host in response to a write request of the host. Furthermore, the memory system may be configured to provide data stored therein to the host in response to a read request of the host. The host may be an electric device capable of processing data, and may include a computer, a digital camera, a mobile phone, or the like. The memory system may be embedded in the host or separately fabricated and connected to the host.

The memory system may include an ECC decoder to improve the reliability of data. The ECC decoder may perform a decoding operation according to a predetermined ECC algorithm, in order to correct an error which has occurred in data.

SUMMARY

Various embodiments are directed to an ECC decoder capable of reducing power consumption by minimizing the use of a memory.

Also, various embodiments are directed to an ECC decoder capable of pre-loading subsequent data in a memory and thus quickly starting a decoding operation corresponding to the subsequent data.

In an embodiment, an ECC decoder may include: a memory comprising a memory region; a first converter configured to transmit a hard bit, received from a channel, to the memory to store the hard bit in a first area of the memory region; a second converter configured to receive the hard bit read from the first area and output a reliability value corresponding to the hard bit, whenever a hard decoding operation on the hard bit is iterated; and a variable node configured to perform the hard decoding operation using the reliability value.

In an embodiment, an ECC decoder may include: a variable node; a memory comprising a memory region configured to have a size corresponding to a reliability value to be transmitted to the variable node; a first converter configured to transmit a hard bit, received from a channel for a hard decoding operation of the variable node, to the memory to store the hard bit in a first area of the memory region, and transmit a subsequent hard bit, received from the channel, to the memory to store the subsequent hard bit in a second area of the memory region; and a second converter configured to decide a reliability value corresponding to the hard bit based on data read from the memory region for the hard decoding operation, and transmit the reliability value to the variable node.

In an embodiment, an ECC decoder may include: a memory comprising a memory region; a first converter configured to transmit a hard bit, received from a channel, to the memory to store the hard bit in the memory region during a hard decoding operation, and determine a soft reliability value corresponding to a soft bit set received from the channel and transmit the soft reliability value to the memory to store the soft reliability value in the memory region during a soft decoding operation; a second converter configured to output a hard reliability value corresponding to the hard bit, received from the memory region, during the hard decoding operation, and output the soft reliability value received from the memory region during the soft decoding operation; and a variable node configured to perform the hard decoding operation using the hard reliability value outputted from the second converter, and perform the soft decoding operation using the soft reliability value outputted from the second converter when the hard decoding operation has failed.

DETAILED DESCRIPTION

Figure 1:
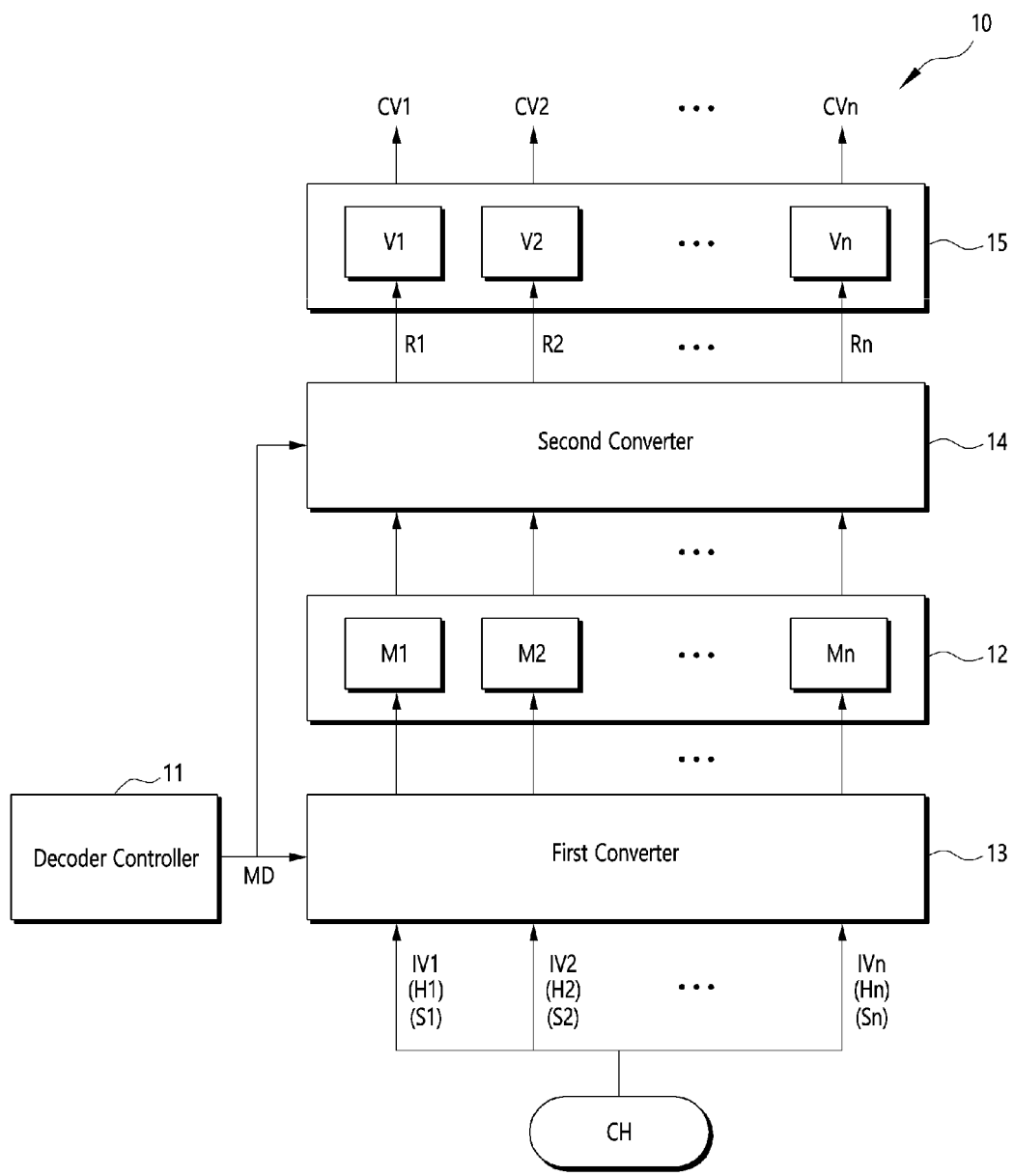
FIG. 1 illustrates an ECC decoder in accordance with an embodiment.

The advantages and characteristics of the present disclosure and a method for achieving the advantages and characteristics will be described through embodiments described below in detail with reference to the accompanying drawings. However, the present disclosure is not limited to the embodiments described herein, but may be embodied in different manners. The present embodiments are only provided to describe the present disclosure in detail, such that the technical idea of the present disclosure can be easily carried out by those skilled in the art to which the present disclosure pertains.

The present embodiments are not limited to specific shapes illustrated in the drawings, but may be exaggerated for clarity. In this specification, specific terms are used. However, the terms are only used to describe the present disclosure, and do not limit the meaning thereof or the scope of the present disclosure, described in claims.

In this specification, an expression such as 'and/or' indicates including one or more of components listed before/after the expression. Moreover, an expression such as 'connected/coupled' indicates that one element is directly connected/coupled to another element or indirectly connected/coupled to the other element through still another element. An expression in a singular form in the present specification includes an expression in a plural form unless referred to the contrary. Furthermore, the expressions 'include' and 'comprise' or 'including' and 'comprising' for a component, step, operation and element indicate the presence or addition of one or more other components, steps, operations and elements.

Hereafter, exemplary embodiments will be described in detail with reference to the drawings.

FIG. 1 illustrates an ECC decoder 10 in accordance with an embodiment.

The ECC decoder 10 may receive data, e.g., input values IV1 to IVn, from a channel CH, correct errors of the data by performing an ECC decoding operation, and output error-corrected data CV1 to CVn, n being a positive integer. The ECC decoding operation may include a hard decoding operation (or hard-decision decoding operation) and a soft decoding operation (or soft-decision decoding operation). The soft decoding operation is performed when the hard decoding operation fails. The ECC decoding operation may be performed according to a min-sum algorithm based on an LDPC (Low-Density Parity-Check) code, but embodiments are not limited thereto. The hard decoding operation and the soft decoding operation may be each iterated within the maximum iteration count until the ECC decoding operation succeeds.

The channel CH may be coupled to a memory apparatus (not illustrated). In this case, the input values IV1 to IVn may be data read from memory cells included in the memory apparatus.

When the hard decoding operation is performed, the input values IV1 to IVn may be hard bits H1 to Hn corresponding to variable nodes V1 to Vn of a calculator 15, respectively. When the channel CH is coupled to the memory apparatus, each of the hard bits H1 to Hn may be data read from the corresponding memory cell by performing one read operation on the corresponding memory cell. One read operation may indicate that one read voltage is applied to a memory cell to read one value (i.e., one hard bit).

When the soft decoding operation is performed, the input values IV1 to IVn may be soft bit sets S1 to Sn respectively corresponding to the variable nodes V1 to Vn. The soft bit sets S1 to Sn may be each composed of a plurality of soft bits, and any one of the soft bits may be equal to a hard bit. For example, a first soft bit set S1 may be composed of a plurality of soft bits including a first hard bit H1. When the channel CH is coupled to the memory apparatus, each of the soft bit sets S1 to Sn may be data read from a corresponding memory cell by performing a plurality of read operations on the corresponding memory cell. The plurality of read operations may indicate that a plurality of read voltages are applied to the corresponding memory cell to read a plurality of values, i.e., the plurality of soft bits.

The ECC decoder 10 may include a decoder controller 11, a memory 12, a first converter 13, a second converter 14, and the calculator 15.

The decoder controller 11 may control overall operations of the ECC decoder 10. The decoder controller 11 may generate a decoding mode signal MD indicating that any one of the hard decoding operation and the soft decoding operation is being performed. In an embodiment, the decoding mode signal MD may further indicate how many bits each reliability value to be generated during the soft decoding operation has. The decoder controller 11 may decide whether to iterate the hard decoding operation and the soft decoding operation, based on the maximum iteration count. Although it is not shown in FIG. 1, the decoder controller 11 may further generate a control signal for write and read operations of the memory 12, and transmit the control signal to the memory 12.

The memory 12 may include a plurality of memory regions M1 to Mn corresponding to the plurality of variable nodes V1 to Vn, respectively. Each of the memory regions M1 to Mn may be used to exclusively store data related to the corresponding variable node, and thus may not store data related to another variable node. As will be described below, the data related to the corresponding variable node may be directly transferred from the channel CH, and include a hard bit corresponding to the variable node and a reliability value to be inputted to the variable node. The memory 12 may perform write and read operations on the memory regions M1 to Mn in response to the control signal transmitted from the decoder controller 11.

Each of the memory regions M1 to Mn may have a size capable of storing two or more bits. In an embodiment, each of the memory regions M1 to Mn may have a size corresponding to the reliability value to be inputted to the corresponding node among the variable nodes V1 to Vn. In another embodiment, each of the memory regions M1 to Mn may have a size capable of additionally storing a subsequent hard bit to be pre-loaded into the memory region.

The memory 12 may include a DRAM (Dynamic Random Access Memory), SRAM (Static Random Access Memory), or the like.

The first converter 13 and the second converter 14 may operate in response to the decoding mode signal MD.

When the hard decoding operation is performed or the decoding mode signal MD indicates that the hard decoding operation is being performed, the first converter 13 may transmit the hard bits H1 to Hn, received from the channel CH, to the memory 12 in order to store the hard bits H1 to Hn in the memory regions M1 to Mn, respectively. Therefore, when the hard decoding operation is performed, only an area for one bit in each of the memory regions M1 to Mn may be used, and the other areas may not be used since the hard bit includes one bit.

When the hard decoding operation is performed, the second converter 14 may receive the hard bits H1 to Hn stored in the memory regions M1 to Mn whenever the hard decoding operation is iterated, decide reliability values R1 to Rn (also referred to as "hard reliability values") corresponding to the hard bits H1 to Hn, respectively, and transmit the reliability values R1 to Rn to the variable nodes V1 to Vn, respectively. For example, the second converter 14 may decide the first reliability value R1 corresponding to the first hard bit H1 stored in the first memory region M1, and transmit the first reliability value R1 to the first variable node V1. Each of the reliability values R1 to Rn may be composed of two or more bits. Each of the reliability values R1 to Rn may be an log likelihood ratio (LLR). The second converter 14 may decide a sign of each reliability value according to each hard bit, and decide a fixed value irrelevant to the hard bit as a magnitude of the reliability value, thereby deciding the reliability value corresponding to the hard bit. For example, for each of the hard bits H1 to Hn, the second converter 14 may decide the corresponding reliability value as +3 when the hard bit is 0, or the corresponding reliability value as −3 when the hard bit is 1. However, embodiments are not limited thereto.

In short, the ECC decoder 10 may store only a hard bit H in each of the memory regions M1 to Mn when performing the hard decoding operation, and generate a reliability value R corresponding to the hard bit H in the second converter 14 whenever the hard decoding operation is iterated. That is, during the hard decoding operation, the reliability values R1 to Rn of the hard bits H1 to Hn may have the same magnitude, and each of the reliability values R1 to Rn has a plus sign or a minus sign (or vice versa) depending on whether the corresponding hard bit is 0 or 1. Therefore, the ECC decoder 10 may store the hard bits H1 to Hn in the memory 12, instead of storing, in the memory 12, the reliability values R1 to Rn which are actually used in the calculator 15, thereby minimizing the use of the memory 12. Since the reliability value occupies more memory space than the hard bit, it is possible to save a memory space in the memory 12 by storing, in the memory 12, the hard bit rather than the reliability value and converting the hard bit into the reliability value in the second converter 14.

In an embodiment, when the hard decoding operation is performed, the remaining areas except the areas where the hard bits H1 to Hn are respectively stored in the memory regions M1 to Mn may be used to store subsequent hard bits transmitted from the channel CH. The subsequent hard bits may be data on which a subsequent hard decoding operation is to be performed, after the current hard decoding operation on the current hard bits H1 to Hn has succeeded. For example, when the current hard bits H1 to Hn are data read from a first page of the memory apparatus, the subsequent hard bits may be data read from a second page of the memory apparatus.

When the soft decoding operation is performed or the decoding mode signal MD indicates that the soft decoding operation is being performed, the first converter 13 may generate reliability values R1 to Rn (also referred to as "soft reliability values") respectively corresponding to the soft bit sets S1 to Sn transmitted from the channel CH, and transmit the reliability values R1 to Rn to the memory 12 to store the reliability values R1 to Rn in the respective memory regions M1 to Mn. For example, the first converter 13 may generate the first reliability value R1 corresponding to the first soft bit set S1, and transmit the first reliability value R1 to the memory 12 to store the first reliability value R1 in the first memory region M1. That is, since the soft bit sets S1 to Sn are each composed of a plurality of soft bits, a method that uses the reliability values R1 to Rn whenever the soft decoding operation is iterated after the soft bit sets S1 to Sn are stored in the memory 12 may have no benefit in minimizing the use of the memory 12. Therefore, in the present embodiment, the memory 12 may be implemented to store the reliability values R1 to Rn rather than the soft bit sets S1 to Sn.

When the soft decoding operation is performed, the second converter 14 may receive the reliability values R1 to Rn stored in the memory regions M1 to Mn and transmit the reliability values R1 to Rn to the respective variable nodes V1 to Vn, whenever the soft decoding operation is iterated. That is, since the reliability values R1 to Rn have been already generated by the first converter 13 when the soft decoding operation is performed, the second converter 14 may transmit the reliability values R1 to Rn from the memory regions M1 to Mn to the variable nodes V1 to Vn as they are, whenever the soft decoding operation is iterated.

In an embodiment, when the soft decoding operation is performed, there may be the remaining areas except the areas where the reliability values R1 to Rn are respectively stored in the memory regions M1 to Mn. In this case, the remaining areas may be used to store subsequent hard bits which are to be transmitted from the channel CH. The subsequent hard bits may be data on which the subsequent hard decoding operation is to be performed, after the soft decoding operation on the soft bit sets S1 to Sn has succeeded. For example, when the current soft bit sets S1 to Sn are data read from the first page of the memory apparatus, the subsequent hard bits may be data read from the second page of the memory apparatus.

The calculator 15 may include the variable nodes V1 to Vn. The variable nodes V1 to Vn may receive the reliability values R1 to Rn transmitted from the second converter 14, respectively, and perform a decoding operation according to a predetermined ECC algorithm, using the reliability values R1 to Rn.

In accordance with the present embodiment, when the hard decoding operation is performed, the use of the memory 12 may be minimized and thus it is possible to reduce power consumption.

Furthermore, in accordance with the present embodiment, the remaining areas which are not used in the memory regions M1 to Mn during the decoding operation may be used to pre-load the subsequent hard bits. By pre-loading the subsequent hard bit, it is possible to more quickly perform the subsequent hard decoding operation.

Figure 2:
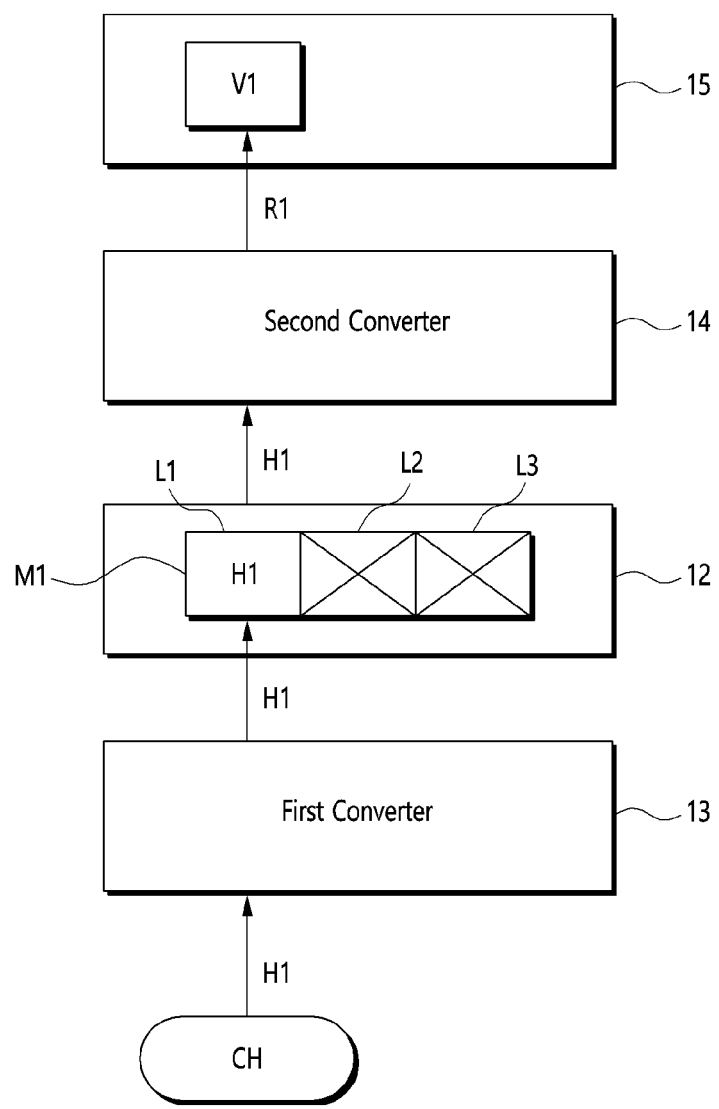
FIG. 2 describes a method of performing a hard decoding operation in accordance with an embodiment.

FIG. 2 describes a method in which the ECC decoder 10 of FIG. 1 performs the hard decoding operation, in accordance with an embodiment. Hereafter, a method for processing the first hard bit H1 will be taken as an example for description. Methods for processing the other hard bits H2 to Hn may be performed in the same manner as the method for processing the first hard bit H1. In an embodiment, each of the memory regions M1 to Mn may be configured to store three bits. Thus, the first memory region M1 may include first to third areas L1 to L3 each configured to store one bit, but embodiments are not limited thereto.

Referring to FIG. 2, the first converter 13 may receive the first hard bit H1 from the channel CH when the hard decoding operation is performed. The first converter 13 may transmit the first hard bit H1 to the memory 12 to store the first hard bit H1 in the first area L1 of the first memory region M1. The memory 12 may store the first hard bit H1 in the first area L1 of the first memory region M1, under the control of the decoder controller 11. At this time, in the first memory region M1, the second and third areas L2 and L3 may not be used.

Whenever the hard decoding operation is iterated, the second converter 14 may decide the first reliability value R1 corresponding to the first hard bit H1 read from the first area L1, and transmit the first reliability value R1 to the first variable node V1. For example, the second converter 14 may decide the first reliability value R1 as +3 when the first hard bit H1 is 0, and decide the first reliability value R1 as −3 when the first hard bit H1 is 1.

The calculator 15 may perform the hard decoding operation using the first reliability value R1 transmitted to the first variable node V1 for the hard bit H1 and using the other reliability values R2 to Rn transmitted to the variable nodes V2 to Vn for the hard bits H2 to Hn.

Figure 3:
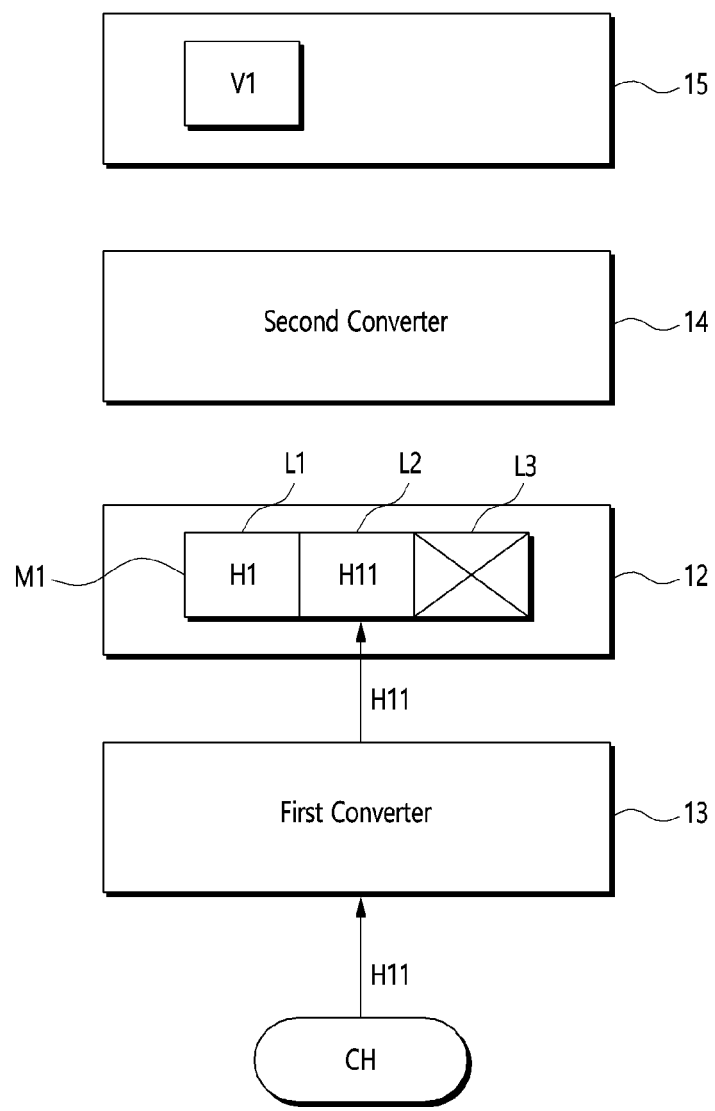
FIG. 3 describes a method of pre-loading a subsequent hard bit while performing a hard decoding operation in accordance with an embodiment.

FIG. 3 describes a method in which the ECC decoder 10 of FIG. 1 pre-loads a subsequent hard bit H11 while performing a hard decoding operation, in accordance with an embodiment.

Referring to FIG. 3, the first converter 13 may receive the subsequent hard bit H11 following the first hard bit H1 from the channel CH, after the first hard bit H1 is stored in the first area L1 of the first memory region M1 as described with reference to FIG. 2. The first converter 13 may transmit the subsequent hard bit H11 to the memory 12 to store the subsequent hard bit H11 in the second area L2 of the first memory region M1. That is, while the calculator 15 performs the hard decoding operation on the first hard bit H1, the subsequent hard bit H11 may be pre-loaded into the second area L2. After the hard decoding operation on the first hard bit H1 has succeeded, the subsequent hard decoding operation on the subsequent hard bit H11 may be performed. That is, the second converter 14 may transmit the first reliability value R1, corresponding to the subsequent hard bit H11 transmitted from the second area L2, to the first variable node V1, in order to perform the subsequent hard decoding operation on the subsequent hard bit H11. At this time, in the first memory region M1, the third area L3 may not be used yet.

In an embodiment, the third area L3 of the first memory region M1 may also be used to store a hard bit (not illustrated) following the subsequent hard bit H11. In this case, after the hard decoding operation on the subsequent hard bit H11 has succeeded, a hard decoding operation on the hard bit stored in the third area L3 may be subsequently performed.

After the hard bits H2 to Hn are stored in the other memory regions M2 to Mn, the remaining areas of the other memory regions M2 to Mn may also be used in a similar manner in order to pre-load subsequent hard bits.

On the other hand, when the hard decoding operation on the first hard bit H1 has failed, the subsequent hard bit H11 pre-loaded in the first memory region M1 may be ignored, and the first reliability value R1 corresponding to the first soft bit set S1 may be stored in the first memory region M1 as will be described below with reference to FIG. 4, in order to subsequently perform a soft decoding operation on the first soft bit set S1.

Figure 4:
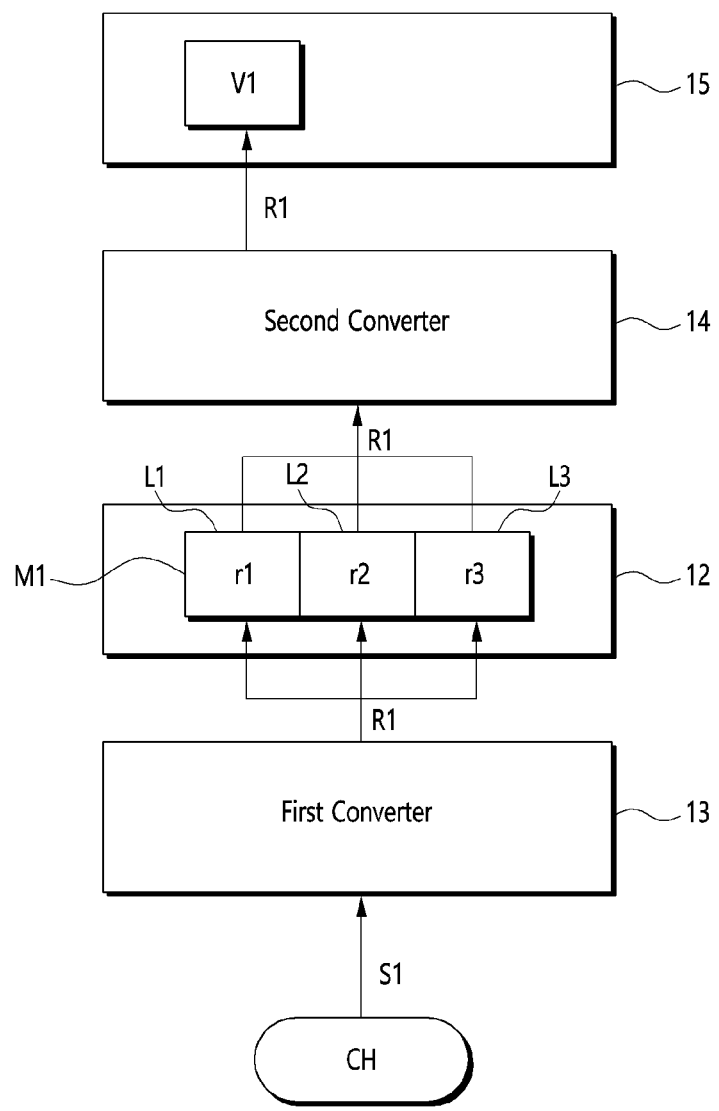
FIG. 4 describes a method of performing a soft decoding operation in accordance with an embodiment.

FIG. 4 describes a method in which the ECC decoder 10 of FIG. 1 performs a soft decoding operation, in accordance with an embodiment. Hereafter, a method for processing the first soft bit set S1 will be taken as an example for description. Methods for processing the other soft bit sets S2 to Sn may be performed in the same manners as the method for processing the first soft bit set S1.

Referring to FIG. 4, the first converter 13 may receive the first soft bit set S1 from the channel CH when the soft decoding operation is performed. The first converter 13 may decide the first reliability value R1 corresponding to the first soft bit set S1, and transmit the first reliability value R1 to the memory 12 to store the first reliability value R1 in the first memory region M1. The first reliability value R1 may be composed of first to third reliability bits r1 to r3. For example, the first reliability bit r1 may indicate a sign, and the second and third reliability bits r2 and r3 may indicate a magnitude. The memory 12 may store the first to third reliability bits r1 to r3 in the first to third areas L1 to L3 of the first memory region M1, respectively, under the control of the decoder controller 11.

Whenever the soft decoding operation is iterated, the second converter 14 may transmit the first reliability value R1, read from the first memory region M1, to the first variable node V1.

The calculator 15 may perform the soft decoding operation by using the first reliability value R1 transmitted to the first variable node V1 for the soft bit set S1 and using the other reliability values R2 to Rn transmitted to the variable nodes V2 to Vn for the soft bit sets S2 to Sn.

In an embodiment, when the first reliability value R1 is composed of only the first and second reliability bits r1 and r2 unlike the illustrated configuration and the subsequent hard bit H11 is pre-loaded in the first memory region M1, the subsequent hard bit H11 pre-loaded in the first memory region M1 may be retained as it is, and the first and second reliability bits r1 and r2 may be stored in the remaining areas of the first memory region M1.

Figure 5:
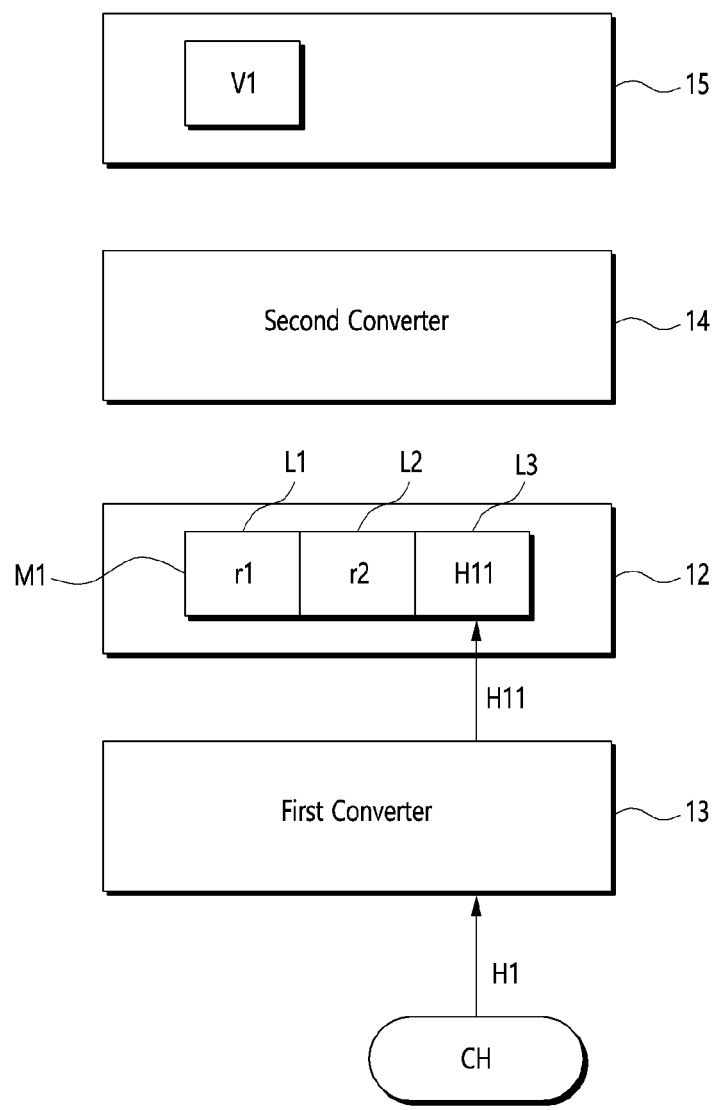
FIG. 5 describes a method of pre-loading a subsequent hard bit while performing a soft decoding operation in accordance with an embodiment.

FIG. 5 describes a method in which the ECC decoder 10 of FIG. 1 pre-loads the subsequent hard bit H11 while performing a soft decoding operation, in accordance with an embodiment.

Referring to FIG. 5, the first reliability value R1 to be used for the soft decoding operation may be composed of only the first and second reliability bits r1 and r2, unlike the embodiment of FIG. 4. In this case, the first reliability value R1 may be stored in the first and second areas L1 and L2 of the first memory region M1. Therefore, after the first reliability value R1 is stored in the first and second areas L1 and L2 of the first memory region M1, the first converter 13 may receive the subsequent hard bit H11 following the first soft bit set S1 from the channel CH, and transmit the subsequent hard bit H11 to the memory 12 to store the subsequent hard bit H11 in the third area L3 of the first memory region M1. That is, while the calculator 15 performs the soft decoding operation on the first soft bit set S1, the subsequent hard bit H11 may be pre-loaded into the third area L3. After the soft decoding operation on the first soft bit set S1 has succeeded, the subsequent hard decoding operation on the subsequent hard bit H11 may be performed. That is, after the soft decoding operation is performed, the second converter 14 may transmit the first reliability value R1, corresponding to the subsequent hard bit H11 transmitted from the third area L3, to the first variable node V1, in order to perform the subsequent hard decoding operation on the subsequent hard bit H11.

Figure 6:
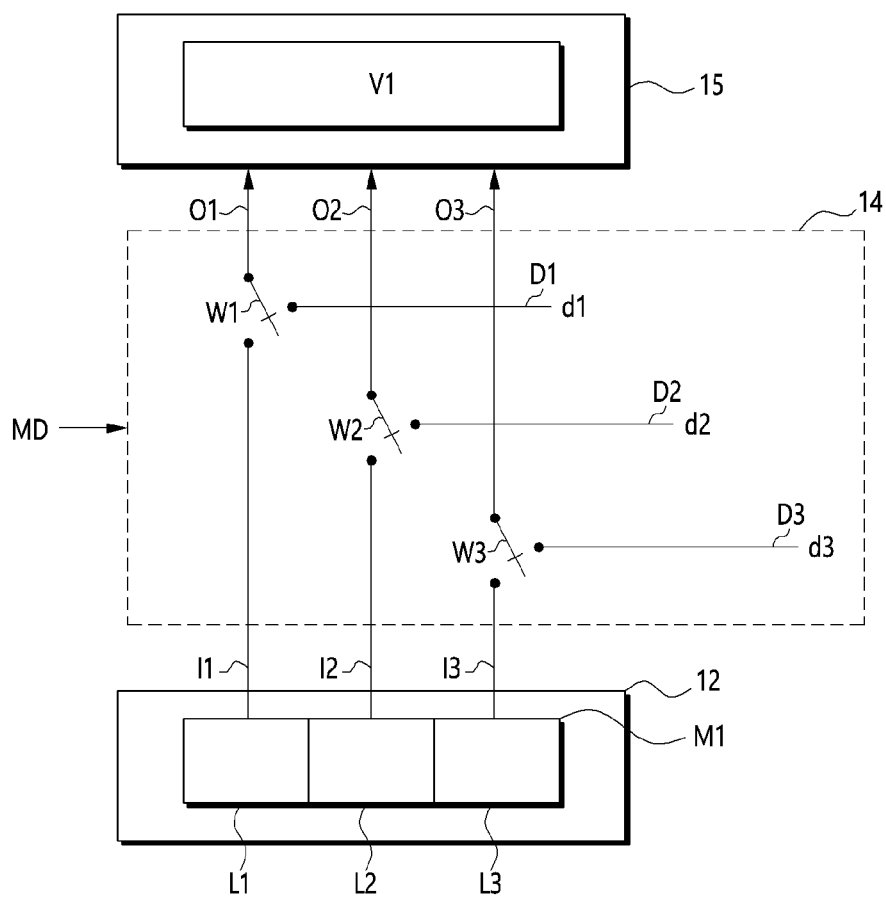
FIG. 6 illustrates a second converter of FIG. 1.

FIG. 6 illustrates the second converter 14 of FIG. 1. FIG. 6 illustrates a portion of the second converter 14 for the first memory region M1 and the first variable node V1, for example. However, the other portions of the second converter 14 for the other memory regions M2 to Mn and the other variable nodes V2 to Vn may be configured in a similar manner.

Referring to FIG. 6, the second converter 14 may be coupled to first to third input lines I1 to I3 that are respectively coupled to the first to third areas L1 to L3 of the first memory region M1, be coupled to first to third output lines O1 to O3 that are coupled to the first variable node V1, and be coupled to first to third fixed value lines D1 to D3 that respectively transfer first to third fixed reliability bits d1 to d3. The second converter 14 may receive values, transmitted from the first to third areas L1 to L3 of the first memory region M1, through the first to third input lines I1 to I3, respectively. The second converter 14 may output the first reliability value R1 to the first variable node V1 through the first to third output lines O1 to O3.

The second converter 14 may include a first switch W1, a second switch W2, and a third switch W3. The first output line O1 may be coupled to the first switch W1, and the first switch W1 may be coupled to one of the first input line I1 and the first fixed value line D1 in response to the decoding mode signal MD. The second output line O2 may be coupled to the second switch W2, and the second switch W2 may be coupled to one of the second input line I2 and the second fixed value line D2 in response to the decoding mode signal MD. The third output line O3 may be coupled to the third switch W3, and the third switch W3 may be coupled to one of the third input line I3 and the third fixed value line D3 in response to the decoding mode signal MD. The first fixed value line D1 may transfer the first fixed reliability bit d1, the second fixed value line D2 may transfer the second fixed reliability bit d2, and the third fixed value line D3 may transfer the third fixed reliability bit d3. All of the first to third fixed reliability bits d1 to d3 may be 1.

Each of the first to third switches W1 to W3 may be selectively coupled to the corresponding input line or fixed value line in response to the decoding mode signal MD indicating the hard decoding operation. Specifically, when the switch, which corresponds to the area where the first hard bit H1 is stored in the first memory region M1, among the first to third switches W1 to W3, is coupled to the corresponding input line, the other switches may be coupled to the corresponding fixed value lines, respectively.

The first to third switches W1 to W3 may be coupled to the first to third input lines I1 to I3, respectively, in response to the decoding mode signal MD indicating the soft decoding operation.

In an embodiment, the number of the input lines and the number of the output lines may be equal to the number of the areas included in the first memory region M1.

Figure 7:
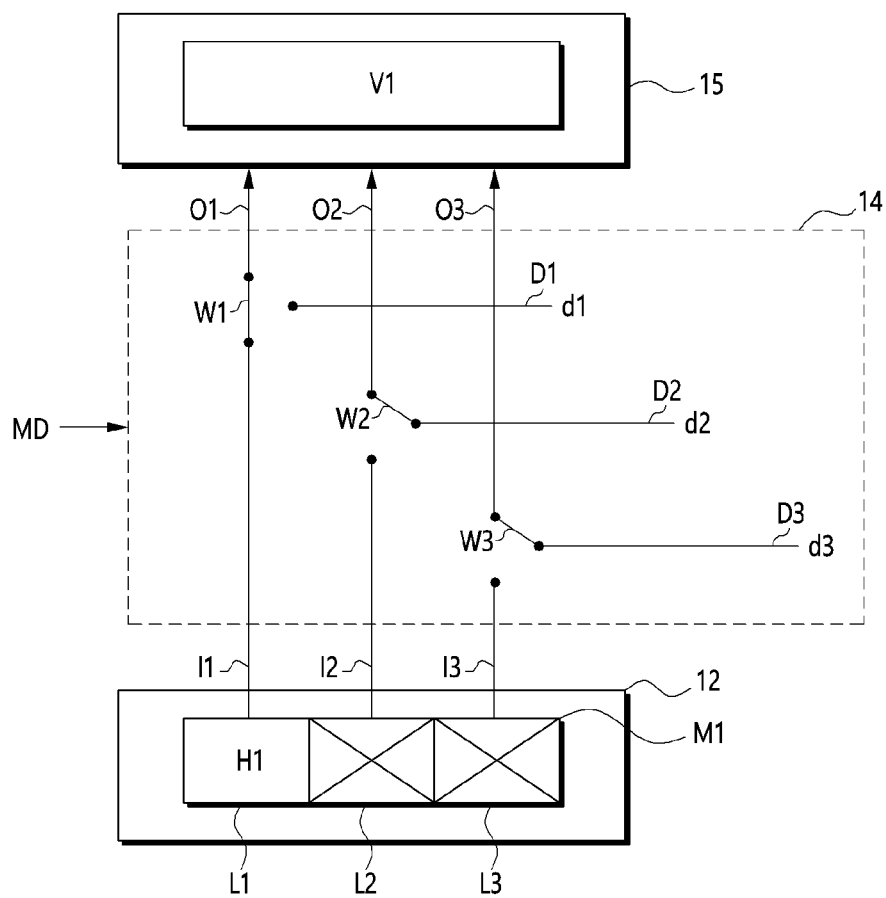
FIG. 7 describes an operation of the second converter of FIG. 6 when the hard decoding operation is performed.

FIG. 7 describes an operation of the second converter 14 of FIG. 6 when the hard decoding operation is performed.

When the hard decoding operation is performed, the first hard bit H1 may be stored in the first area L1 of the first memory region M1, and the second and third areas may not be used.

Therefore, when the hard decoding operation is performed, the first switch W1 in the second converter 14 may be coupled to the first input line I1 The second converter 14 may receive the first hard bit H1 from the first area L1 through the first input line I1, and transmit the first hard bit H1 as a sign of the first reliability value R1 to the calculator 15 through the first output line O1. For example, the first hard bit H1 having a value of 1 may be transmitted as a minus sign to the calculator 15, and the first hard bit H1 having a value of 0 may be transmitted as a plus sign to the calculator 15.

When the hard decoding operation is performed, the second and third switches W2 and W3 may be coupled to the second and third fixed value lines D2 and D3, respectively. The second converter 14 may transmit the second fixed reliability bit d2, received through the second fixed value line D2, to the calculator 15 through the second output line O2, and transmit the third fixed reliability bit d3, received through the third fixed value line D3, to the calculator 15 through the third output line O3. For example, when the first reliability value R1 is decided as +3 or −3 during the hard decoding operation, both of the second and third fixed reliability bits d2 and d3 may be 1.

Figure 8:
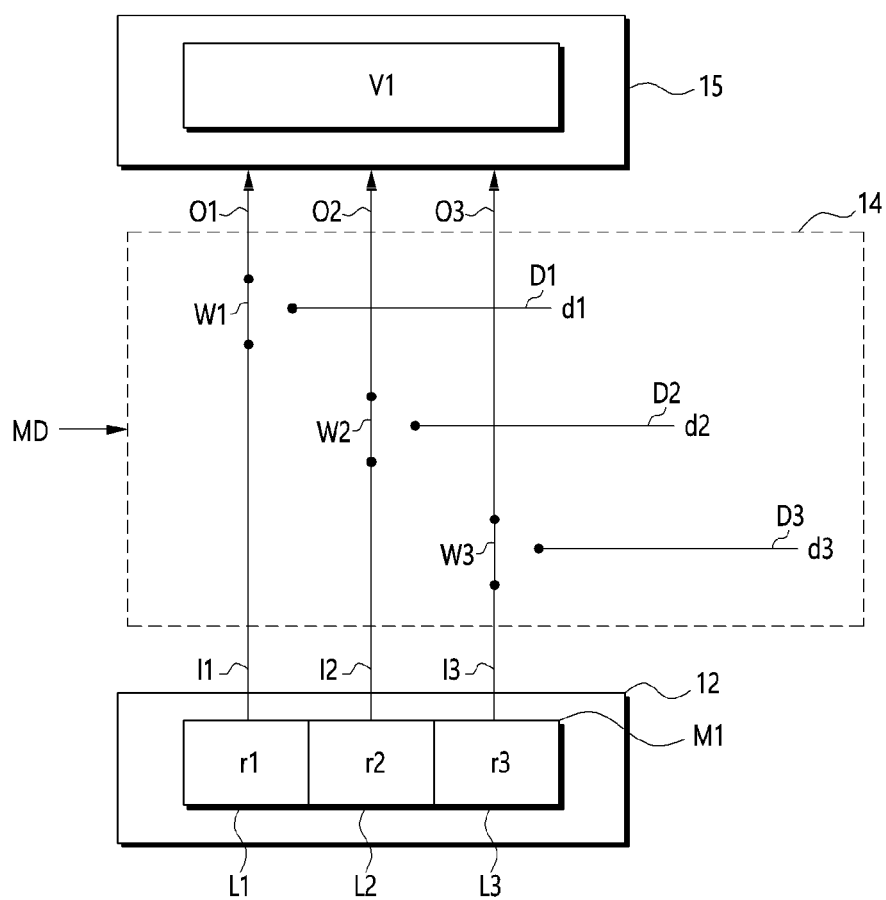
FIG. 8 describes an operation of the second converter of FIG. 6 when the soft decoding operation is performed.

FIG. 8 describes an operation of the second converter 14 of FIG. 6 when the soft decoding operation is performed.

When the soft decoding operation is performed, the first reliability value R1 composed of the first to third reliability bits r1 to r3 may be stored in the first to third areas L1 to L3 of the first memory region M1 as described above.

When the soft decoding operation is performed, the first to third switches W1 to W3 may be coupled to the first to third input lines I1 to I3, respectively. The second converter 14 may receive the first to third reliability bits r1 to r3 transmitted from the first to third areas L1 to L3 through the first to third input lines I1 to I3, and transmit the first to third reliability bits r1 to r3 as the first reliability value R1 to the first variable node V1 through the first to third output lines O1 to O3.

Figure 9:
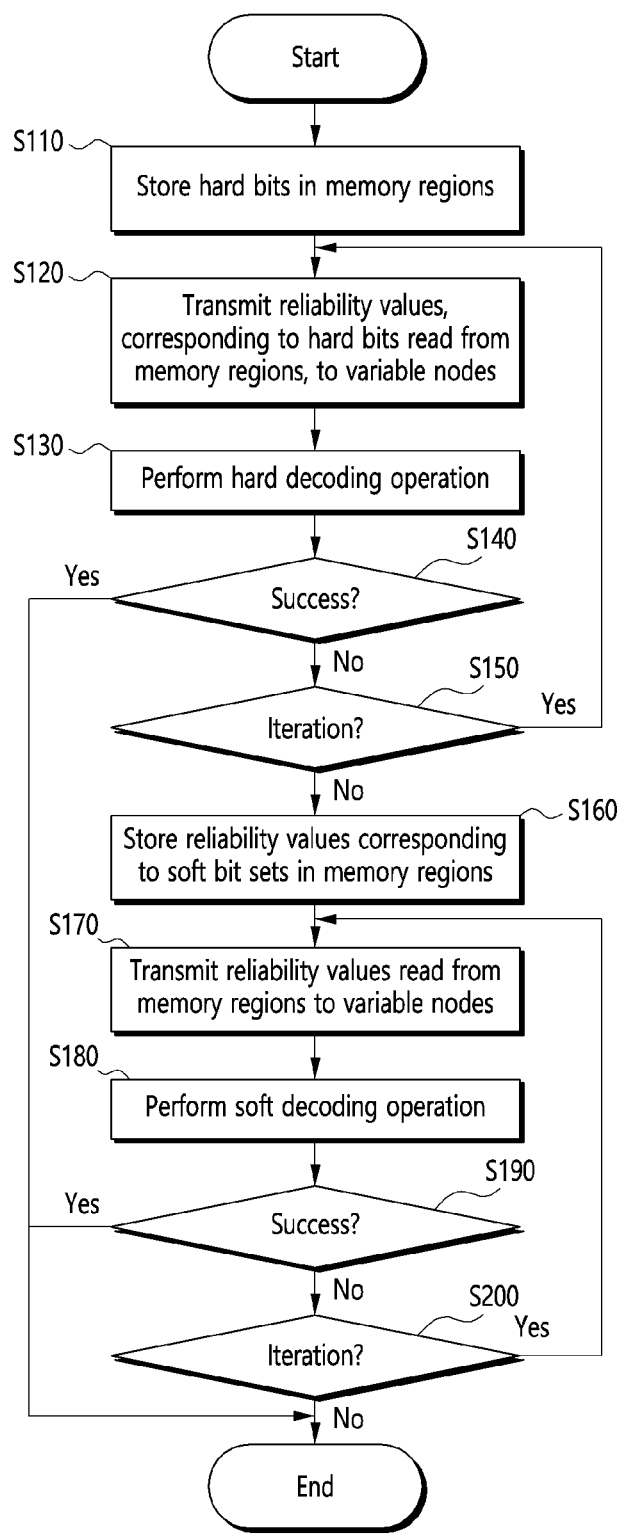
FIG. 9 is a flowchart illustrating an operation of the ECC decoder of FIG. 1.

FIG. 9 is a flowchart illustrating an operation of the ECC decoder 10 of FIG. 1.

Referring to FIG. 9, the first converter 13 may transmit the hard bits H1 to Hn, received from the channel CH, to the memory 12 to store the hard bits H1 to Hn in the memory regions M1 to Mn, respectively, in step S110. In an embodiment, the first converter 13 may transmit subsequent hard bits, pre-loaded through the channel CH, to the memory 12 to additionally store the subsequent hard bits in the remaining areas except the areas where the hard bits H1 to Hn are respectively stored in the memory regions M1 to Mn.

In step S120, the second converter 14 may transmit the reliability values R1 to Rn to the variable nodes V1 to Vn of the calculator 15, the reliability values R1 to Rn respectively corresponding to the hard bits H1 to Hn read from the memory regions M1 to Mn.

In step S130, the calculator 15 may perform the hard decoding operation based on the ECC algorithm, using the reliability values R1 to Rn.

In step S140, the calculator 15 may decide whether the hard decoding operation has succeeded or failed. When the hard decoding operation has succeeded, the procedure may be ended. When the hard decoding operation has failed, the procedure may proceed to step S150.

In step S150, the decoder controller 11 may decide whether to iterate the hard decoding operation. For example, when a current iteration count is less than the maximum iteration count, the decoder controller 11 may decide to iterate the hard decoding operation. When the current iteration count reaches the maximum iteration count, the decoder controller 11 may decide not to iterate the hard decoding operation. When the decoder controller 11 decides to iterate the hard decoding operation, the procedure may go back to step S120. When the decoder controller 11 decides not to iterate the hard decoding operation, the procedure may proceed to step S160.

In step S160, the first converter 13 may transmit the reliability values R1 to Rn, corresponding to the soft bit sets S1 to Sn transmitted from the channel CH, to the memory 12 to store the reliability values R1 to Rn in the memory regions M1 to Mn, respectively. In an embodiment, the first converter 13 may store subsequent hard bits, pre-loaded through the channel CH, to the memory 12 to additionally store the subsequent hard bits in the remaining areas except the areas where the reliability values R1 to Rn are respectively stored in the memory regions M1 to Mn.

In step S170, the second converter 14 may transmit the reliability values R1 to Rn, read from the memory regions M1 to Mn, to the variable nodes V1 to Vn of the calculator 15.

In step S180, the calculator 15 may perform the soft decoding operation based on the ECC algorithm, using the reliability values R1 to Rn.

In step S190, the calculator 15 may decide whether the soft decoding operation has succeeded or failed. When the soft decoding operation has succeeded, the procedure may be ended. When the soft decoding operation has failed, the procedure may proceed to step S200.

In step S200, the decoder controller 11 may decide whether to iterate the soft decoding operation. For example, when a current iteration count is less than the maximum iteration count, the decoder controller 11 may decide to iterate the soft decoding operation. When the current iteration count reaches the maximum iteration count, the decoder controller 11 may decide not to iterate the soft decoding operation. When the decoder controller 11 decides to iterate the soft decoding operation, the procedure may go back to step S170. When deciding not to iterate the soft decoding operation, the decoder controller 11 may decide that the soft decoding operation has failed, and the procedure may be ended.

Figure 10:
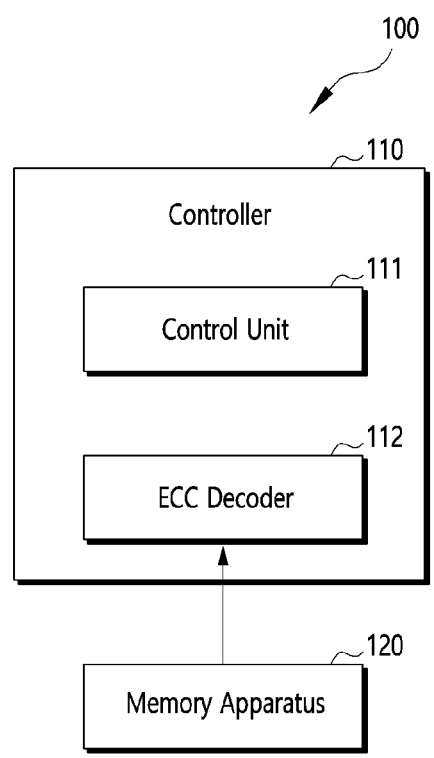
FIG. 10 illustrates a memory system including an ECC decoder in accordance with an embodiment.

FIG. 10 illustrates a memory system 100 including an ECC decoder 112 in accordance with an embodiment.

Referring to FIG. 10, the memory system 100 may be configured to store data provided from an external host in response to a write request of the host. Furthermore, the memory system 100 may be configured to provide data stored therein to the host in response to a read request of the host.

Examples of the memory system 100 may include a PCMCIA (Personal Computer Memory Card International Association) card, a CF (Compact Flash) card, a smart media card, a memory stick, various multimedia cards (MMC, eMMC, RS-MMC, and MMC-micro), SD (Secure Digital) cards (SD, Mini-SD, and Micro-SD), a UFS (Universal Flash Storage), an SSD (Solid State Drive), and the like.

The memory system 100 may include a controller 110 and a memory apparatus 120.

The controller 110 may control overall operations of the memory system 100. The controller 110 may control the memory apparatus 120 to perform a foreground operation according to an instruction of the host. The foreground operation may include an operation of writing data to the memory apparatus 120 or reading data from the memory apparatus 120 according to the instruction of the host, e.g., a write or read request.

The controller 110 may further control the memory apparatus 120 to perform a background operation which is internally required regardless of an instruction of the host. The background operation may include one or more of a wear-leveling operation, a garbage collection operation, an erase operation, a read reclaim operation, and a refresh operation performed on the memory apparatus 120. The background operation may include an operation of writing data to the memory apparatus 120 and reading data from the memory apparatus 120, like the foreground operation.

The controller 110 may include a control unit 111 and the ECC decoder 112.

The control unit 111 may control write and read operations of the memory apparatus 120, and control a decoding operation of the ECC decoder 112. The control unit 111 may control the memory apparatus 120 to output data by performing a read operation, and control the ECC decoder 112 to perform the decoding operation on the data outputted from the memory apparatus 120. In an embodiment, the control unit 111 may control the ECC decoder 112 to pre-load subsequent data following the data on which the ECC decoder 112 is performing the decoding operation. When the current decoding operation succeeds, the control unit 111 may control the ECC decoder 112 to subsequently perform a subsequent decoding operation on the subsequent data pre-loaded in the ECC decoder 112.

The ECC decoder 112 may be configured and operate in substantially the same manner as the ECC decoder 10 of FIG. 1.

The memory apparatus 120 may store data transmitted from the controller 110, and read data stored therein and transmit the read data to the controller 110, under the control of the controller 110.

The memory apparatus 120 may be a nonvolatile memory apparatus. Examples of the memory apparatus 120 may include a flash memory such as NAND flash or NOR flash, FeRAM (Ferroelectric Random Access Memory), PCRAM (Phase-Change Random Access Memory), MRAM (Magnetic Random Access Memory), ReRAM (Resistive Random Access Memory), and the like.

In accordance with the embodiments, the ECC decoder can reduce the power consumption by minimizing the use of the memory.

Furthermore, the ECC decoder can pre-load subsequent data in the remaining unused areas of the memory, and thus quickly start a subsequent decoding operation on the subsequent data.

While various embodiments have been described above, it will be understood to those skilled in the art that the embodiments described are examples only. Accordingly, the ECC decoder described herein should not be limited based on the described embodiments.

What is claimed is:

1. An error correcting code (ECC) decoder, comprising:
a memory comprising a memory region;
a first converter configured to transmit a hard bit, received from a channel, to the memory to store the hard bit in a first area of the memory region;
a second converter configured to receive the hard bit read from the first area and output a reliability value corresponding to the hard bit, whenever a hard decoding operation on the hard bit is iterated; and
a variable node configured to perform the hard decoding operation using the reliability value,
wherein the second converter decides a sign of the reliability value according to the hard bit, decides a fixed value as a magnitude of the reliability value, and outputs the reliability value to the variable node.

2. The ECC decoder of claim 1, wherein the memory region has a size corresponding to the reliability value, and
wherein remaining areas except the first area in the memory region are not used when the hard decoding operation is performed.

3. The ECC decoder of claim 1, wherein after the hard bit is stored in the first area, the first converter transmits a subsequent hard bit, received from the channel, to the memory to store the subsequent hard bit in a second area of the memory region, and
wherein the subsequent hard bit is data on which a subsequent hard decoding operation is to be performed after the hard decoding operation on the hard bit has succeeded.

4. The ECC decoder of claim 1, wherein the first converter receives a soft bit set transmitted from the channel, and transmits a reliability value corresponding to the soft bit set to the memory to store the reliability value corresponding to the soft bit set in the memory region, the soft bit set including a plurality of soft bits,
wherein the second converter transmits the reliability value corresponding to the soft bit set, which is read from the memory region, to the variable node whenever a soft decoding operation on the soft bit set is iterated, and
wherein the variable node performs the soft decoding operation using the reliability value corresponding to the soft bit set.

5. The ECC decoder of claim 4, wherein after the reliability value corresponding to the soft bit set is stored in the memory region, the first converter transmits a subsequent hard bit, received from the channel, to the memory to store the subsequent hard bit in a remaining area of the memory region that remains unused, and wherein the subsequent hard bit is data on which a subsequent hard decoding operation is to be performed after the soft decoding operation has succeeded.

6. The ECC decoder of claim 1, wherein the second converter is coupled to input lines for receiving values read from the memory region, coupled to output lines for outputting the reliability value to the variable node, and coupled to fixed value lines for receiving fixed reliability bits, wherein the second converter includes switches to which the output lines are respectively coupled, and wherein each of the switches is selectively coupled to a corresponding input line of the input lines or a corresponding fixed value line of the fixed value lines.

7. The ECC decoder of claim 6, wherein when the hard decoding operation is performed, a first switch of the switches is coupled to a first input line, each of the other switches is coupled to a corresponding fixed value line, and the first input line receives the hard bit read from the first area, and wherein when a soft decoding operation is performed, each of the switches is coupled to a corresponding input line.

8. The ECC decoder of claim 7, wherein the second converter outputs the hard bit, received through the first input line, as flail the sign of the reliability value, to the variable node through a first output line coupled to the first switch.

9. An error correcting code (ECC) decoder, comprising:
a variable node;
a memory comprising a memory region configured to have a size corresponding to a reliability value to be transmitted to the variable node;
a first converter configured to transmit a hard bit, received from a channel for a hard decoding operation of the variable node, to the memory to store the hard bit in a first area of the memory region, and transmit a subsequent hard bit, received from the channel, to the memory to store the subsequent hard bit in a second area of the memory region; and
a second converter configured to decide a reliability value corresponding to the hard bit based on data read from the memory region for the hard decoding operation, and transmit the reliability value to the variable node.

10. The ECC decoder of claim 9, wherein whenever the hard decoding operation for the hard bit is iterated, the second converter receives the data read from the memory region, and decides the reliability value.

11. The ECC decoder of claim 9, wherein the first converter receives a soft bit set transmitted from the channel for a soft decoding operation of the variable node, and transmits a reliability value corresponding to the soft bit set to the memory to store the reliability value corresponding to the soft bit set in the memory region, the soft bit set including a plurality of soft bits, and the second converter transmits the reliability value corresponding to the soft bit set, read from the memory region, to the variable node to perform the soft decoding operation.

12. The ECC decoder of claim 11, wherein after the reliability value corresponding to the soft bit set is stored in the memory region, the first converter transmits a subsequent hard bit, received from the channel, to the memory to store the subsequent hard bit in a remaining area of the memory region that remains unused, and wherein the subsequent hard bit is data on which a subsequent hard decoding operation is to be performed after the soft decoding operation has succeeded.

13. The ECC decoder of claim 9, wherein the second converter decides the reliability value corresponding to the hard bit by deciding a sign of the reliability value according to the hard bit and deciding a fixed value as a magnitude of the reliability value.

14. The ECC decoder of claim 9, wherein the second converter is coupled to input lines for receiving the data read from the memory region, coupled to output lines for outputting the reliability value to the variable node, and coupled to fixed value lines for receiving fixed reliability bits, wherein the second converter includes switches and the output lines are respectively coupled to the switches, and wherein each of the switches is selectively coupled to a corresponding input line of the input lines or a corresponding fixed value line of the fixed value lines.

15. An error correcting code (ECC) decoder, comprising:
a memory comprising a memory region;
a first converter configured to transmit a hard bit, received from a channel, to the memory to store the hard bit in the memory region during a hard decoding operation, and determine a soft reliability value corresponding to a soft bit set received from the channel and transmit the soft reliability value to the memory to store the soft reliability value in the memory region during a soft decoding operation, the soft bit set including a plurality of soft bits;
a second converter configured to output a hard reliability value corresponding to the hard bit, received from the memory region, during the hard decoding operation, and output the soft reliability value received from the memory region during the soft decoding operation; and
a variable node configured to perform the hard decoding operation using the hard reliability value outputted from the second converter, and perform the soft decoding operation using the soft reliability value outputted from the second converter when the hard decoding operation has failed.

16. The ECC decoder of claim 15, wherein the memory region has a size corresponding to the soft reliability value, wherein areas other than a first area where the hard bit is stored in the memory region remain unused when the hard decoding operation is performed.

17. The ECC decoder of claim 15, wherein after the hard bit is stored in a first area of the memory region, the first converter transmits a subsequent hard bit, received from the channel, to the memory to store the subsequent hard bit in a second area of the memory region, wherein the subsequent hard bit is data on which a subsequent hard decoding operation is to be performed after the hard decoding operation has succeeded.

18. The ECC decoder of claim 15, wherein after the soft reliability value is stored in the memory region, the first converter transmits a subsequent hard bit, received from the channel, to the memory to store the subsequent hard bit in a remaining area of the memory region that remains unused, wherein the subsequent hard bit is data on which a subsequent hard decoding operation is to be performed after the soft decoding operation has succeeded.

19. The ECC decoder of claim 15, wherein the second converter decides a sign of the hard reliability value according to the hard bit, decides a fixed value as a magnitude of the hard reliability value, and outputs the hard reliability value to the variable node.

\* \* \* \* \*